US009713278B2

(12) United States Patent
Lee et al.

(10) Patent No.: US 9,713,278 B2
(45) Date of Patent: Jul. 18, 2017

(54) DISPLAY APPARATUS

(71) Applicant: Samsung Display Co., Ltd., Yongin (KR)

(72) Inventors: Ik-Sang Lee, Cheonan-si (KR); Won-Chul Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 73 days.

(21) Appl. No.: 14/304,482

(22) Filed: Jun. 13, 2014

(65) Prior Publication Data

US 2015/0163947 A1    Jun. 11, 2015

(30) Foreign Application Priority Data

Dec. 9, 2013   (KR) ........................ 10-2013-0152201

(51) Int. Cl.
| | |
|---|---|
| *F21V 7/04* | (2006.01) |
| *H05K 7/14* | (2006.01) |
| *H05K 5/00* | (2006.01) |
| *F21V 8/00* | (2006.01) |
| *G02F 1/1333* | (2006.01) |
| *H05K 1/18* | (2006.01) |
| *H05K 1/14* | (2006.01) |

(52) U.S. Cl.
CPC ......... *H05K 7/1427* (2013.01); *G02B 6/0073* (2013.01); *G02F 1/133308* (2013.01); *H05K 1/189* (2013.01); *H05K 5/0017* (2013.01); *G02F 2001/133314* (2013.01); *H05K 1/147* (2013.01); *H05K 2201/10106* (2013.01); *H05K 2201/10136* (2013.01)

(58) Field of Classification Search
CPC ......... H05K 2201/10136; G02F 2001/133314; G02F 1/133308; Y10S 248/917–248/923; G09F 1/13336
See application file for complete search history.

(56) References Cited

U.S. PATENT DOCUMENTS

| | | | |
|---|---|---|---|
| 5,995,179 A * | 11/1999 | Tamura | G09F 9/3026 349/58 |
| 6,937,297 B2 | 8/2005 | Kang et al. | |
| 7,147,196 B2 | 12/2006 | Knight et al. | |
| 7,679,894 B2 | 3/2010 | Yue et al. | |
| 7,924,363 B2 | 4/2011 | Park | |

(Continued)

FOREIGN PATENT DOCUMENTS

| | | |
|---|---|---|
| JP | 2008-116495 | 5/2008 |
| KR | 10-0443832 | 8/2004 |

(Continued)

*Primary Examiner* — Andrew Coughlin
*Assistant Examiner* — Meghan Ulanday
(74) *Attorney, Agent, or Firm* — H.C. Park & Associates, PLC

(57) ABSTRACT

A display apparatus includes a display panel displaying an image, a mold frame disposed under the display panel to support the display panel and a lower receiving container receiving the display panel and the mold frame and having an opening portion, a bottom portion having a chamfered portion that at least one of a corner of the opening portion is chamfered, a side wall extended from the bottom portion to an upper direction and an engaging portion extended from the side wall to be protruded to an outside direction.

17 Claims, 11 Drawing Sheets

(56) References Cited

U.S. PATENT DOCUMENTS

| | | |
|---|---|---|
| 8,111,351 B2 | 2/2012 | Cho et al. |
| 8,432,507 B2 | 4/2013 | Dai |
| 2009/0009682 A1* | 1/2009 | Chung et al. .................. 349/58 |
| 2009/0090709 A1* | 4/2009 | Shalomoff ......... B65D 11/1833 220/6 |
| 2012/0120339 A1 | 5/2012 | Kim et al. |
| 2013/0050987 A1 | 2/2013 | Yang et al. |

FOREIGN PATENT DOCUMENTS

| | | |
|---|---|---|
| KR | 10-2011-0088811 | 8/2011 |
| KR | 10-1165869 | 7/2012 |
| KR | 10-2012-0113935 | 10/2012 |
| KR | 10-1221128 | 1/2013 |
| KR | 10-1261307 | 5/2013 |

\* cited by examiner

DISPLAY APPARATUS

CROSS REFERENCE TO RELATED APPLICATION

This application claims priority from and the benefit of Korean Patent Application No. 10-2013-0152201, filed on Dec. 9, 2013 which is hereby incorporated by reference for all purposes as if fully set forth herein.

BACKGROUND

Field

Exemplary embodiments of the present inventive concept relate to a display apparatus. More particularly, exemplary embodiments of the present inventive concept relate to a display apparatus capable of improving reliability of a liquid crystal.

Discussion of the Background

Flat panel display apparatuses that can decrease the weight and volume associated with cathode ray tubes (CRTs) are being developed. Liquid crystal displays (LCDs), plasma display panels (PDPs), field emission display devices (FEDs), and light emitting display devices are actively being researched as flat-type display apparatuses. Among such flat display apparatuses, liquid crystal displays are easily manufactured, have good drivability of drivers, realize a high-quality image, and, thus, are attracting much attention.

Generally, a display apparatus may include a display panel for displaying an image and a receiving container that receives the display panel and a cover member. A bracket formed on the receiving container may engage the receiving container to the cover member. In addition, the bracket may be engaged to the cover member by a screw.

However, when the bracket is engaged to the cover member by a screw, pressure may be generated to the bracket by the screw. Thus, the bracket may be transformed by the pressure and a receiving container may be transformed by the transformation of the bracket. As a result, the transformed receiving container presses against the liquid crystal of the display apparatus, and a fault in the liquid crystal may be caused.

SUMMARY OF THE INVENTIVE CONCEPT

Exemplary embodiments of the present inventive concept provide a display apparatus capable of decreasing a fault in the liquid crystal.

Additional features of the invention will be set forth in the description which follows, and in part will be apparent from the description, or may be learned by practice of the invention.

In an exemplary embodiment of a display apparatus according to the present inventive concept, the display apparatus includes a display panel configured to display an image, a mold frame disposed under the display panel to support the display panel, and a lower receiving container receiving the display panel and the mold frame. The lower receiving container includes an opening portion, a bottom portion having a chamfered portion in which at least one corner of the opening portion is chamfered, a side wall extended from the bottom portion in an upper direction, and an engaging portion extended from the side wall and protruding in an outside direction.

In an exemplary embodiment of a display apparatus according to the present inventive concept, the display apparatus includes a display panel configured to display an image, a mold frame disposed under the display panel supporting the display panel and a lower receiving container receiving the display panel and the mold frame. The lower receiving container includes a bottom portion having an opening portion, a side wall extended from the bottom portion in an upper direction, and an engaging portion engaged with the side wall. The engaging portion is rotatable.

According to the present inventive concept as explained above, the bottom portion of the lower receiving container has a chamfered portion. Thus, pressure from the engaging portion may be diffused. Therefore, the reliability of the display apparatus may be improved.

In addition, a rotatable engaging portion is engaged with the side wall of the lower receiving container, so that pressure from the engaging portion may be decreased. Therefore, the reliability of the display apparatus is improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
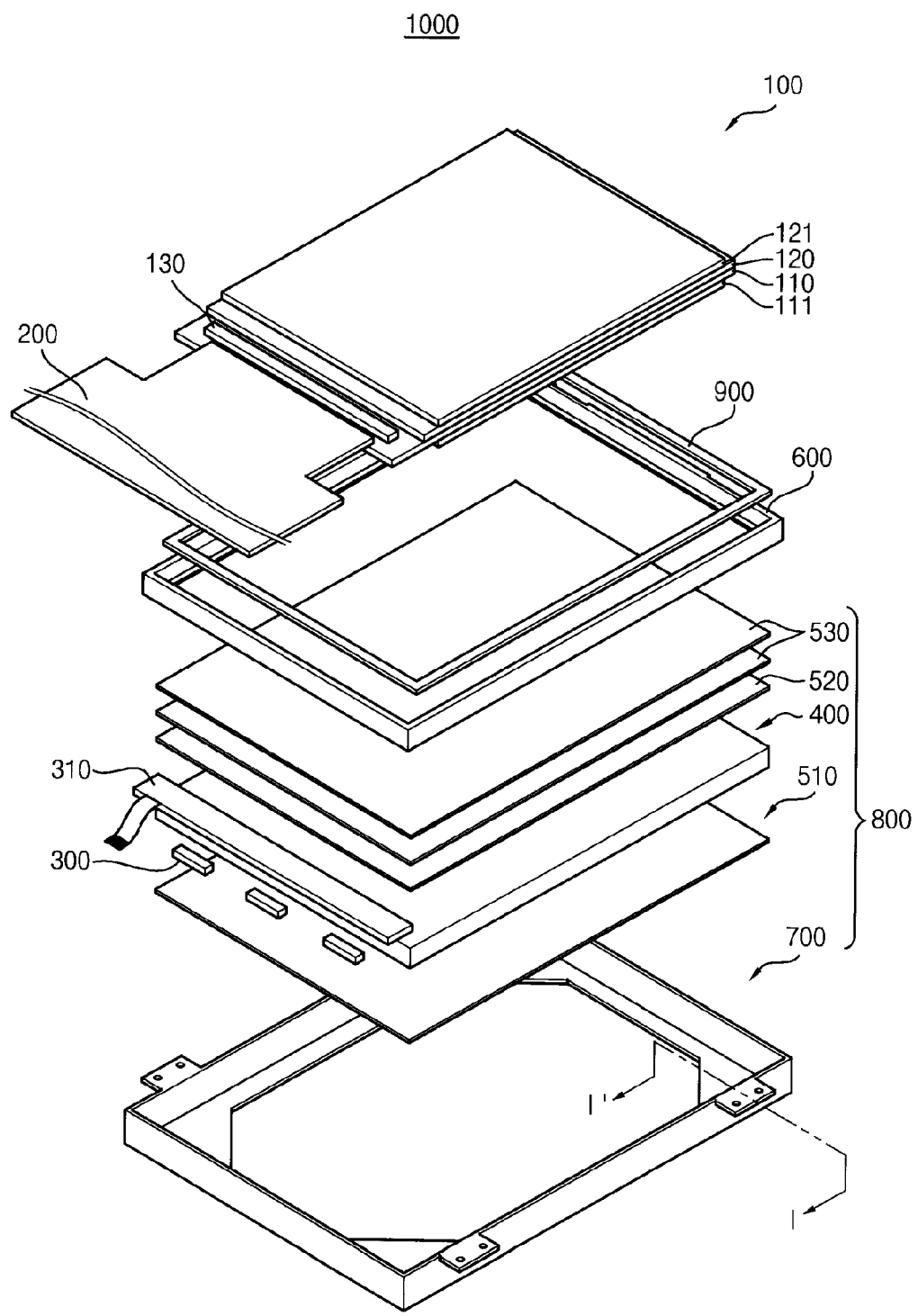
FIG. 1 is an exploded perspective view illustrating an exemplary embodiment of a display apparatus according to the inventive concept.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
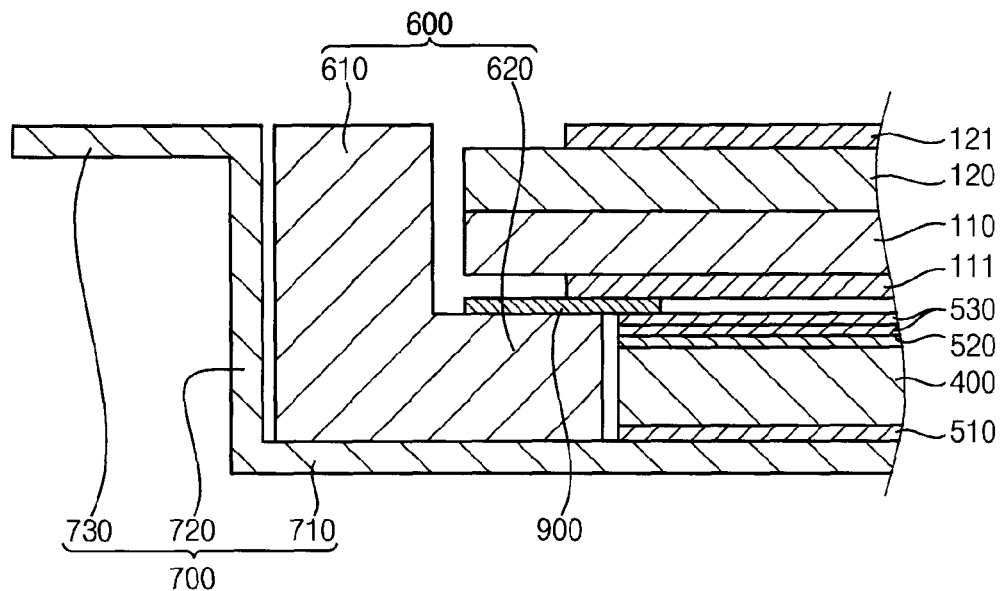
FIG. 2 is a cross-sectional view taken along line I-I' of FIG. 1.

FIG. 1 is an exploded perspective view illustrating an exemplary embodiment of display apparatus according to the inventive concept. FIG. 2 is a cross-sectional view taken along line I-I' of FIG. 1.

Referring to FIGS. 1 and 2, a display apparatus 1000 according to an exemplary embodiment of the present inventive concept includes a display panel 100 for displaying an image, a main flexible printed circuit 200 electrically connected to the display panel 100, and a backlight assembly 800 for supplying light to the display panel 100.

The display panel 100 includes a first substrate 110, a second substrate 120 facing the first substrate 110, a liquid crystal layer disposed between the first substrate 110 and the second substrate 120, a first polarizing film 111 disposed on a lower surface of the first substrate 110 and a second polarizing film 121 disposed on an upper surface of the second substrate 120. An image is displayed on the display panel 100 using a light from the backlight assembly 800.

The first substrate 110 may include a thin film transistors formed in a matrix. A source electrode of the thin film transistor may be electrically connected to a gate line. A gate electrode of the thin film transistor may be electrically connected to a gate line. A drain electrode of the thin film transistor may be electrically connected to a pixel electrode. The pixel electrode may include a transparent conductive material. For example, the pixel electrode may include a transparent conductive material, such as indium tin oxide (ITO), indium zinc oxide (IZO) and etc. In addition, the pixel electrode may include titanium (Ti) and/or molybdenum titanium (MoTi).

The second substrate 120 faces the first substrate 110. The second substrate 120 may include a color filter. The second substrate 120 may include a common electrode. The common electrode may face the pixel electrode. The common electrode may include a transparent conductive material. For example, the common electrode may include a transparent conductive material, such as indium tin oxide (ITO), indium zinc oxide (IZO) and etc. In addition, the common electrode may include titanium (Ti) and/or molybdenum titanium (MoTi).

When a power voltage is applied to the gate electrode of the thin film transistor, the thin film transistor is turned on and an electric field is formed between the pixel electrode and the common electrode. The electric field varies the alignment angle of the liquid crystal molecules of the liquid crystal layer disposed between the first substrate 110 and the second substrate 120. Thus, a light transmittance of the liquid crystal layer is varied in accordance with the variation of the alignment angle of the liquid crystal, so an image may be displayed.

The first polarizing film 111 may be disposed on a lower surface of the first substrate 110. The first polarizing film 111 may have a first polarization axis. The first polarizing film 111 may polarize light in a first direction. The second polarizing film 121 may be disposed on an upper surface of the second substrate 120. The second polarizing film 121 may have a second polarization axis. The second polarizing film 121 may polarize light in a second direction crossing the first direction. For example, the first polarization axis may cross the second polarization axis.

The display panel 100 may further include a driving chip 130. The driving chip 130 may drive the first substrate 110. The driving chip 130 generates a driving signal driving the first substrate 110 in response to a control signal applied from other elements described below. In the present exemplary embodiment, the driving chip 130 may be disposed at an end of the first substrate 110. For example, the driving chip 130 may be electrically connected to the first substrate 110 by a chip on glass process.

The main flexible printed circuit 200 is electrically connected to an end of the first substrate 110 to apply a control signal to the display panel 100. For example, the main flexible printed circuit 200 may be electrically connected to the first substrate 110 by a chip on glass process. In the present exemplary embodiment, the main flexible printed circuit 200 is connected to the end of the first substrate 110 and bent to contact a lower surface of the display panel 100. The main flexible printed circuit 200 may include a resin having flexibility.

The backlight assembly 800 is disposed under the display panel 100. The backlight assembly 800 includes a light source unit generating light, a mold frame 600 covering an outside of the light source unit, and a lower receiving container 700 receiving the display panel 100 and the mold frame 600.

The light source unit may include a flexible printed circuit board 310, a light source 300, a light guide plate 400 and a plurality of optical sheets.

The flexible printed circuit board 310 may provide the light source 300 disposed thereon with driving power. In the present exemplary embodiment, the flexible printed circuit board 310 may be disposed under the first substrate 110 in an area corresponding to an end of the display panel 100. The flexible printed circuit board 310 may include a resin having flexibility. The flexible printed circuit board 310 may include a metal line disposed thereon.

The light source 300 disposed on the flexible printed circuit board 310 generates light. In the present exemplary embodiment, the light source 300 may be mounted on the flexible printed circuit board 310. For example, the light source 300 may include a light emitting diode (LED) emitting a white light. The number of the light sources 300 may be determined in consideration of size and brightness of the display panel 100. In the present exemplary embodiment, the flexible printed circuit board 310 and the light source 300 may be disposed at an end of the light guide plate 400.

The light guide plate 400 may be disposed under the display panel 100. The light guide plate 400 may be formed as a plate shape. The light guide plate 400 may be disposed adjacent to the light source 300 and may face a light exit surface of the light source 300. The light guide plate 400 may include a groove (not shown). The light source 300 may be inserted into the groove (not shown), so that loss of light may be decreased. The light guide plate 400 guides light emitted from the light source 300 toward the display panel 100.

The light guide plate 400 may include a transparent material to minimize a loss of light from the light source 300. The light guide plate 400 may include a material having superior strength, such as polymethylmethacrylate (PMMA).

Alternatively, in order to reduce a thickness of the light guide plate 400, the light guide plate 400 may include polycarbonate (PC). Polycarbonate is inferior in strength to the polymethylmethacrylate, but the polycarbonate is superior in heat-resistance to the polymethylmethacrylate.

The optical sheets may improve luminance characteristics of light emitted from the light guide plate 400. The optical sheets may include a reflecting sheet 510, a diffusion sheet 520 and a prism sheet 530.

The reflecting sheet 510 may be disposed under the light guide plate 400. The reflecting sheet 510 reflects light that may leak through a lower surface of the light guide plate 400 back to the light guide plate 400, so that light efficiency is enhanced.

The diffusion sheet 520 may be disposed on the light guide plate 400. The diffusion sheet 520 may diffuse light exiting from the light guide plate 400.

The prism sheet 530 may be disposed on the diffusion sheet 520. The prism sheet 530 may condense light exiting from the light guide plate 400. For example, the prism sheet 530 may include a vertical prism sheet condensing light in a vertical direction and a horizontal prism sheet condensing light in a horizontal direction.

The mold frame 600 may cover an outside of the light source unit to expose a lower surface of the light source unit. The mold frame 600 may be engaged with the display panel 100 disposed on the light source unit. The mold frame 600 may be formed as a frame shape. The mold frame 600 may include a macromolecule material. For example, the mold frame 600 may include a material having superior strength, such as polymethylmethacrylate (PMMA).

Alternatively, in order to reduce a thickness of the mold frame 600, the mold frame 600 may include polycarbonate (PC). The polycarbonate is inferior in strength to the polymethylmethacrylate, but the polycarbonate is superior in heat-resistance to the polymethylmethacrylate.

Referring to FIG. 2, the mold frame 600 may include a side wall portion 610 and a supporting portion 620. The side wall portion 610 may surround an edge of the display panel 100. The supporting portion 620 may extend from the side wall portion 610 in an inner direction. An edge of the display panel 100 may be disposed on the supporting portion 620. A height of the supporting portion 620 may be substantially the same as a height of the light source unit. The supporting portion 620 may guide and support the edge of the display panel 100.

The lower receiving container 700 may receive the light source unit. The lower receiving container 700 may include a material having superior strength, such as a metal. For example, the lower receiving container 700 may be formed as a metal chassis.

The lower receiving container 700 may include a bottom portion 710, a side wall 720 extending from the bottom portion 710 and an engaging portion 730 extending from the side wall 720 and protruding to an outside direction. The bottom portion 710 may include an opening portion. The bottom portion 710 may have a chamfered portion. At least one of a corner of the opening portion is chamfered. For example, the bottom portion 710 may have four chamfered portions formed at four edges of the bottom portion 710.

The display apparatus 1000 may include a bonding sheet 900. The bonding sheet 900 may be disposed on the supporting portion 620 of the mold frame 600 and may overlap with an edge of the optical sheet. The bonding sheet 900 may have a frame shape. The bonding sheet 900 may bond a lower surface of the display panel 100 to an upper surface of the supporting portion 620 of the mold frame 600. The bonding sheet 900 may include, for example, double-sided tape.

Figure 3:
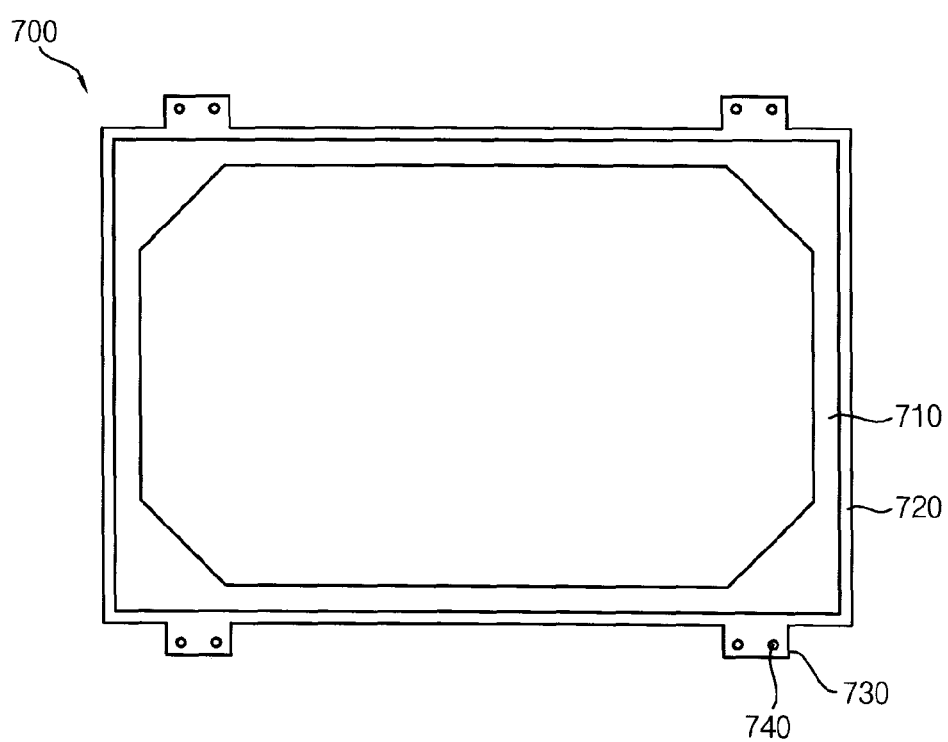
FIG. 3 is a plan view illustrating an exemplary embodiment of a lower receiving container according to the inventive concept.
Figure 4:
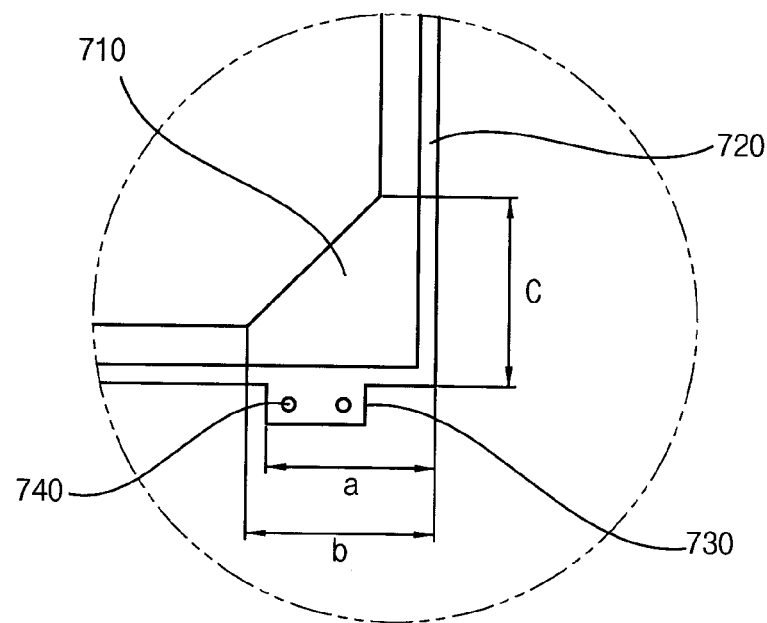
FIG. 4 is a plan view illustrating an exemplary embodiment of an edge portion of a lower receiving container according to the inventive concept.

FIG. 3 is a plan view illustrating an exemplary embodiment of a lower receiving container according to the inventive concept. FIG. 4 is a plan view illustrating an exemplary embodiment of an edge portion of a lower receiving container according to the inventive concept.

Referring to FIGS. 3 and 4, a lower receiving container 700 according to an exemplary embodiment of the present inventive concept may include a bottom portion 710, a side wall 720, and an engaging portion 730. The engaging portion 730 may include a fastener hole 740. The lower receiving container 700 may be engaged with a cover member. When the lower receiving container 700 is engaged with a cover member, a fastener is inserted into the fastener hole 740. Thus, the lower receiving container 700 may be engaged with a cover member. Here, the fastener may be any type of fastener that can suitably couple the lower receiving container 700 with the cover member, such as, for example, a screw.

The bottom portion 710 may include an opening portion. The bottom portion 710 may have a chamfered portion in which at least one corner of the opening portion is chamfered. For example, the bottom portion 710 may have four chamfered portions formed at four edges of the bottom portion 710. The chamfered portion is formed as a right-angled triangle having a first length b in a first direction and a second length c in a second direction crossing the first direction. The first length b is a length from an end of a shorter side of the lower receiving container 700 to an end of the chamfered portion in the first direction. The second length c is a length from an end of a longer side of the lower receiving container 700 to an end of the chamfered portion in the second direction.

The engaging portion 730 may be engaged with a cover member. For example, the engaging portion 730 may be engaged to the cover member by a screw. When engaging portion 730 is engaged to the cover member by a screw, pressure may be generated by the screw. Thus, the engaging portion 730 may be transformed by the pressure and the lower receiving container 700 may be transformed if the engaging portion 730 is transformed. In addition, the transformed lower receiving container 700 may press the liquid crystal of a display apparatus, such that a fault in the liquid crystal may be created. However, the bottom portion 710 of the lower receiving container 700 according to the present exemplary embodiment has a chamfered portion, such that a pressure from the engaging portion 730 may be diffused. Thus, a fault in the display apparatus may be prevented.

The side wall 720 is extended from the bottom portion 710. An inner surface of the side wall 720 may face a side surface of the mold frame 600. In addition, an inner surface of the side wall 720 may contact with a side surface of the mold frame 600.

The engaging portion 730 is extended from the side wall 720 and protrudes in an outer direction. The engaging portion 730 may be formed at a longer side of the lower receiving container 700. For example, the engaging portion 730 may be formed at both ends of the longer side of the lower receiving container 700. The engaging portion 730 may include a plurality of fastener holes 740. For example, the engaging portion 730 may include two fastener holes 740. A screw may be inserted into the fastener hole 740.

An inner end of the engaging portion 730 is spaced apart from a shorter side of the lower receiving container 700 as a third length a. The third length a is a length from an end of a shorter side of the lower receiving container 700 to an inner end of the engaging portion 730. The third length a may be shorter than the first length b.

When engaging portion 730 is engaged to the cover member by a screw, pressure may be generated by the screw. Thus, the pressure may be delivered to the bottom portion 710 of the lower receiving container 700. However, the bottom portion 710 of the lower receiving container 700 according to the present exemplary embodiment has a plurality of chamfered portions, so the pressure from the engaging portion 730 may be diffused. When the third length a is longer than the first length b, the pressure from the engaging portion 730 may be diffused away from chamfered portion along the long side of lower receiving container 700. Thus, the bottom portion 710 of the lower receiving container 700 may press the liquid crystal of a display apparatus. Accordingly, a fault in a liquid crystal of a display apparatus may be caused. However, when the third length a is shorter than the first length b, as it is according to the present exemplary embodiment, the pressure from the engaging portion 730 may be diffused towards the chamfered portion. Thus, the bottom portion 710 of the lower receiving container 700 may not press the liquid crystal of a display apparatus. Accordingly, a fault in the liquid crystal of a display apparatus may be prevented.

Figure 5:
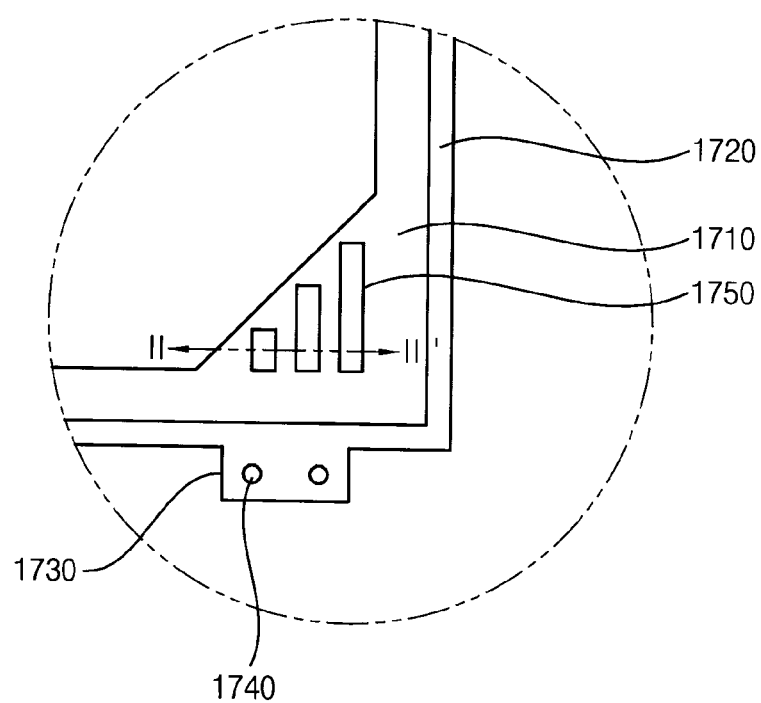
FIG. 5 is a plan view illustrating an exemplary embodiment of an edge portion of a lower receiving container according to the inventive concept.
Figure 6:
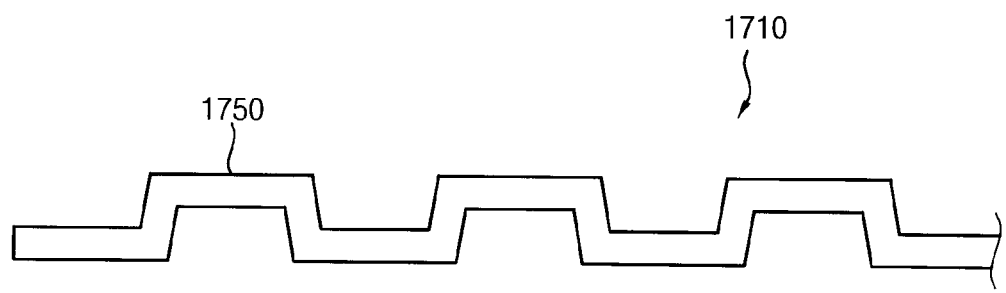
FIG. 6 is a cross-sectional view taken along line II-II' of FIG. 5.

FIG. 5 is a plan view illustrating an exemplary embodiment of an edge portion of a lower receiving container according to the inventive concept. FIG. 6 is a cross-sectional view taken along line II-II' of FIG. 5.

A lower receiving container 1700 according to the present example embodiment is substantially the same as the lower receiving container 700 according to the previous example embodiment of FIG. 4 excepting for a protruding portion 1750, and thus the same reference numerals will be used to refer to the same or like parts as those described in the previous example embodiment of FIG. 4.

Referring to FIGS. 5 and 6, a lower receiving container 1700 according to an exemplary embodiment of the present inventive concept may include a bottom portion 1710, a side wall 1720, and an engaging portion 1730. The engaging portion 1730 may include a fastener hole 1740. The lower receiving container 1700 may be engaged with a cover member. When the lower receiving container 1700 is engaged with a cover member, a screw is inserted into the fastener hole 1740. Thus, the lower receiving container 1700 may be engaged with a cover member. A plurality of protruding portions 1750 may be formed on the chamfered portion formed at the bottom portion 1710. The protruding portions 1750 may be formed by a beading process.

The protruding portions 1750 may protrude from the bottom portion 1710 in an upper direction away from bottom portion 1710. The protruding portion 1750 may extend in a second direction parallel to a shorter side of the lower receiving container 1700. The protruding portion 1750 may be formed as a rectangle shape in a plan view. The protruding portion 1750 may be formed by a beading process. For example, the protruding portion 1750 may be formed parallel to the second direction. The protruding portion 1750 may be formed as three rectangle shapes in a plan view.

According to the present exemplary embodiment, the bottom portion 1710 of the lower receiving container 1700 has a plurality of protruding portions 1750, so that contact between the bottom portion 1710 of the lower receiving container 1700 and the light source unit may be decreased. Thus, pressure from the bottom portion 1710 of the lower receiving container 1700 may be diffused. Thus, a fault in a display apparatus may be prevented.

Figure 7:
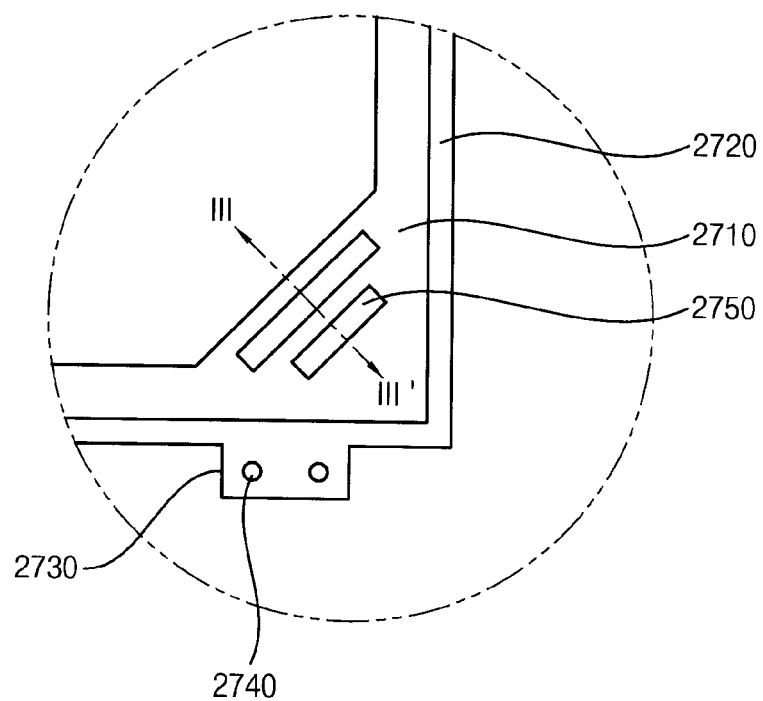
FIG. 7 is a plan view illustrating an exemplary embodiment of an edge portion of a lower receiving container according to the inventive concept.
Figure 8:
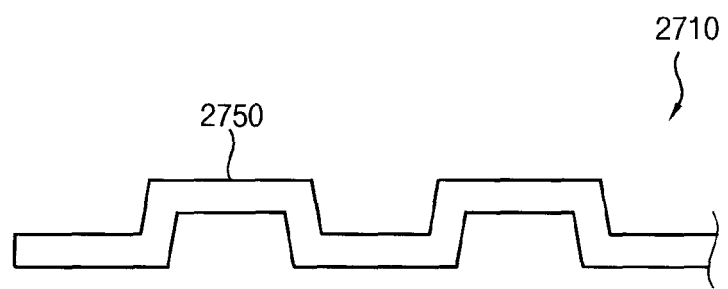
FIG. 8 is a cross-sectional view taken along line III-III' of FIG. 7.

FIG. 7 is a plan view illustrating an exemplary embodiment of an edge portion of a lower receiving container according to the inventive concept. FIG. 8 is a cross-sectional view taken along line III-III' of FIG. 7.

A lower receiving container 2700 according to the present example embodiment is substantially the same as the lower receiving container 700 according to the previous example embodiment of FIG. 4 excepting for a protruding portion 2750, and thus the same reference numerals will be used to refer to the same or like parts as those described in the previous example embodiment of FIG. 4.

Referring to FIGS. 7 and 8, a lower receiving container 2700 according to an exemplary embodiment of the present inventive concept may include a bottom portion 2710, a side wall 2720, and an engaging portion 2730. The engaging portion 2730 may include a fastener hole 2740. The lower receiving container 2700 may be engaged with a cover member. When the lower receiving container 2700 is engaged with a cover member, a screw is inserted into the fastener hole 2740. Thus, the lower receiving container 2700 may be engaged with a cover member. A plurality of protruding portions 2750 may be formed on the chamfered portion formed at the bottom portion 2710. The protruding portions 2750 may be formed by a beading process.

The protruding portions 2750 may protrude from the bottom portion 2710 in an upward direction away from bottom portion 2710. The protruding portion 2750 may extend in a direction parallel to an inclined side of the chamfered portion. The protruding portion 2750 may be formed as a rectangle shape in a plan view. The protruding portion 2750 may be formed by a beading process. For example, the protruding portion 2750 may be formed parallel to an inclined side of the chamfered portion. The protruding portion 2750 may be formed as two rectangle shapes in a plan view.

According to the present exemplary embodiment, the bottom portion 2710 of the lower receiving container 2700 has a plurality of protruding portions 2750, so that contact between the bottom portion 2710 of the lower receiving container 2700 and the light source unit may be decreased. Thus, a pressure from the bottom portion 2710 of the lower receiving container 2700 may be diffused. Thus, a fault in the display apparatus may be prevented.

Figure 9:
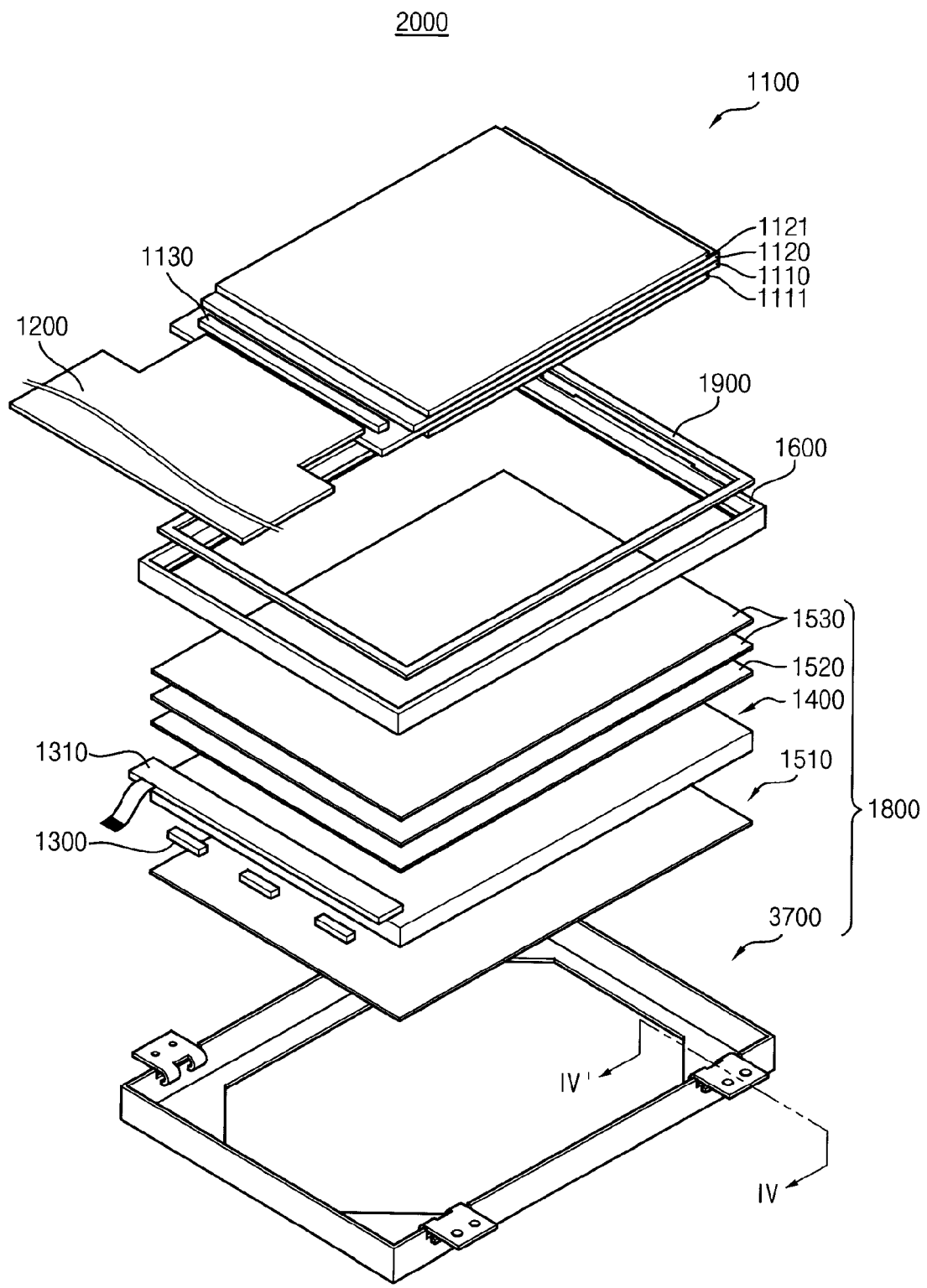
FIG. 9 is an exploded perspective view illustrating an exemplary embodiment of display apparatus according to the inventive concept.
Figure 10:
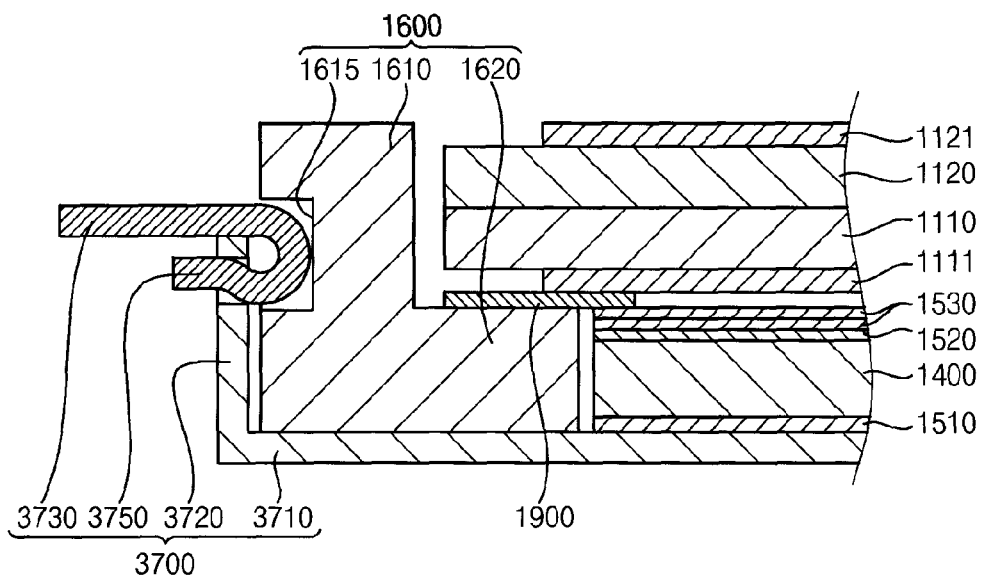
FIG. 10 is a cross-sectional view taken along line IV-IV' of FIG. 9.

FIG. 9 is an exploded perspective view illustrating an exemplary embodiment of display apparatus according to the inventive concept. FIG. 10 is a cross-sectional view taken along line IV-IV' of FIG. 9.

Referring to FIGS. 9 and 10, a display apparatus 2000 according to an exemplary embodiment of the present inventive concept includes a display panel 1100 configured to display an image, a main flexible printed circuit 1200 electrically connected to the display panel 1100 and a backlight assembly 1800 supplying light to the display panel 1100.

The display panel 1100 includes a first substrate 1110, a second substrate 1120 facing the first substrate 1110, a liquid crystal layer disposed between the first substrate 1110 and the second substrate 1120, a first polarizing film 1111 disposed on a lower surface of the first substrate 1110, and a second polarizing film 1121 disposed on an upper surface of the second substrate 1120. An image is displayed on the display panel 1100 using a light from the backlight assembly 1800.

The first substrate 1110 may include thin film transistors formed as a matrix. A source electrode of the thin film transistor may be electrically connected to a gate line. A gate electrode of a thin film transistor may be electrically connected to a gate line. A drain electrode of the thin film transistor may be electrically connected to a pixel electrode. The pixel electrode may include a transparent conductive material. For example, the pixel electrode may include a transparent conductive material, such as indium tin oxide (ITO), indium zinc oxide (IZO) and etc. In addition, the pixel electrode may include titanium (Ti) and/or molybdenum titanium (MoTi).

The second substrate 1120 faces the first substrate 1110. The second substrate 1120 may include a color filter. The second substrate 1120 may include a common electrode. The common electrode may face the pixel electrode. The common electrode may include a transparent conductive material. For example, the common electrode may include a transparent conductive material such as indium tin oxide (ITO), indium zinc oxide (IZO) and etc. In addition, the common electrode may include titanium (Ti) and/or molybdenum titanium (MoTi).

When a power voltage is applied to the gate electrode of the thin film transistor, the thin film transistor is turned on and an electric field is formed between the pixel electrode and the common electrode. The electric field varies the alignment angle of the liquid crystal molecules of the liquid crystal layer disposed between the first substrate 110 and the second substrate 1120. Thus, a light transmittance of the liquid crystal layer is varied in accordance with the variation of the alignment angle of the liquid crystal, so an image may be displayed.

The first polarizing film 1111 may be disposed on a lower surface of the first substrate 1110. The first polarizing film 111 may have a first polarization axis. The first polarizing film 111 may polarize light in a first direction. The second polarizing film 1121 may be disposed on an upper surface of the second substrate 1120. The second polarizing film 1121 may have a second polarization axis. The second polarizing film 1121 may polarize light in a second direction crossing the first direction. For example, the first polarization axis may cross the second polarization axis.

The display panel 1100 may further include a driving chip 1130. The driving chip 1130 may drive the first substrate 1110. The driving chip 1130 generates a driving signal driving the first substrate 1110 in response to a control signal applied from other elements described below. In the present exemplary embodiment, the driving chip 1130 may be disposed at an end of the first substrate 1110. For example, the driving chip 1130 may be electrically connected to the first substrate 1110 by a chip on glass process.

The main flexible printed circuit 1200 is electrically connected to an end of the first substrate 1110 to apply a control signal to the display panel 1100. For example, the main flexible printed circuit 1200 may be electrically connected to the first substrate 1110 by a chip on glass process. In the present exemplary embodiment, the main flexible printed circuit 1200 is connected to the end of the first substrate 1110 and bent to contact a lower surface of the display panel 1100. The main flexible printed circuit 1200 may include a resin having flexibility.

The backlight assembly 1800 is disposed under the display panel 1100. The backlight assembly 1800 includes a light source unit generating light, a mold frame 1600 covering an outside of the light source unit, and a lower receiving container 1700 receiving the display panel 1100 and the mold frame 1600.

The light source unit may include a flexible printed circuit board 1310, a light source 1300, a light guide plate 1400 and a plurality of optical sheets.

The flexible printed circuit board 1310 may provide the light source 1300 disposed thereon with driving power. In the present exemplary embodiment, the flexible printed circuit board 1310 may be disposed under the first substrate 1110 in an area corresponding to an end of the display panel 1100. The flexible printed circuit board 1310 may include a resin having flexibility. The flexible printed circuit board 1310 may include a metal line disposed thereon.

The light source 1300 disposed on the flexible printed circuit board 1310 generates light. In the present exemplary embodiment, the light source 1300 may be mounted on the flexible printed circuit board 1310. For example, the light source 1300 may include a light emitting diode (LED) emitting a white light. The number of the light sources 1300 may be determined in consideration of size and brightness of the display panel 1100. In the present exemplary embodiment, the flexible printed circuit board 1310 and the light source 1300 may be disposed at an end of the light guide plate 1400.

The light guide plate 1400 may be disposed under the display panel 1100. The light guide plate 1400 may be formed as a plate shape. The light guide plate 1400 may be disposed adjacent to the light source 1300 and may face a light exit surface of the light source 1300. The light guide plate 1400 may include a groove (not shown). The light source 1300 may be inserted into the groove (not shown), so that loss of light may be decreased. The light guide plate 1400 guides light emitted from the light source 300 toward the display panel 1100.

The light guide plate 1400 may include a transparent material to minimize a loss of light from the light source 1300. The light guide plate 1400 may include a material having superior strength, such as polymethylmethacrylate (PMMA).

Alternatively, in order to reduce a thickness of the light guide plate 1400, the light guide plate 1400 may include polycarbonate (PC). Polycarbonate is inferior in strength to the polymethylmethacrylate, but the polycarbonate is superior in heat-resistance to the polymethylmethacrylate.

The optical sheets may improve luminance characteristics of light emitted from the light guide plate 1400. The optical sheets may include a reflecting sheet 1510, a diffusion sheet 1520 and a prism sheet 1530.

The reflecting sheet 1510 may be disposed under the light guide plate 1400. The reflecting sheet 1510 reflects light that may leak through a lower surface of the light guide plate 1400 back to the light guide plate 1400, so that light efficiency is enhanced.

The diffusion sheet 1520 may be disposed on the light guide plate 1400. The diffusion sheet 1520 may diffuse light exiting from the light guide plate 1400.

The prism sheet 1530 may be disposed on the diffusion sheet 1520. The prism sheet 1530 may condense light exiting from the light guide plate 1400. For example, the prism sheet 1530 may include a vertical prism sheet condensing light in a vertical direction and a horizontal prism sheet condensing light in a horizontal direction.

The mold frame 1600 may cover an outside of the light source unit to expose a lower surface of the light source unit. The mold frame 1600 may be engaged with the display panel 1100 disposed on the light source unit. The mold frame 1600 may be formed as a frame shape. The mold frame 1600 may include a macromolecule material. For example, the mold frame 1600 may include a material having superior strength, such as polymethylmethacrylate (PMMA).

Alternatively, in order to reduce a thickness of the mold frame 1600, the mold frame 1600 may include polycarbonate (PC). The polycarbonate is inferior in strength to the polymethylmethacrylate, but the polycarbonate is superior in heat-resistance to the polymethylmethacrylate.

Referring to FIG. 10, the mold frame 1600 may include a side wall portion 1610 and a supporting portion 1620. The side wall portion 1610 may surround an edge of the display panel 1100. The supporting portion 1620 may extend from the side wall portion 1610 in an inner direction. An edge of the display panel 1100 may be disposed on the supporting portion 1620. A height of the supporting portion 1620 may be substantially the same as a height of the light source unit. The supporting portion 1620 may guide and support the edge of the display panel 1100.

The mold frame 1600 according to the present exemplary embodiment may have a recess 1615 formed in side wall portion 1610. The recess 1615 may receive a fastener portion 3750 of an engaging portion 3730.

The lower receiving container 3700 may receive the light source unit. The lower receiving container 3700 may include a material having superior strength, such as a metal. For example, the lower receiving container 3700 may be formed as a metal chassis.

The lower receiving container 3700 may include a bottom portion 3710, a side wall 3720 extending from the bottom portion 3710 and an engaging portion 3730 extending from the side wall 3720 and protruding to an outside direction. The bottom portion 3710 may include an opening portion. The bottom portion 3710 may have a chamfered portion. At least one of a corner of the opening portion is chamfered. For example, the bottom portion 3710 may have four chamfered portions formed at four edges of the bottom portion 3710.

The display apparatus 2000 may include a bonding sheet 1900. The bonding sheet 1900 may be disposed on the supporting portion 1620 of the mold frame and may overlap with an edge of the optical sheet. The bonding sheet 1900 may have a frame shape. The bonding sheet 1900 may bond a lower surface of the display panel 1100 to an upper surface of the supporting portion 1620 of the mold frame 1600. The bonding sheet 1900 may include, for example, a double-sided tape.

Figure 11:
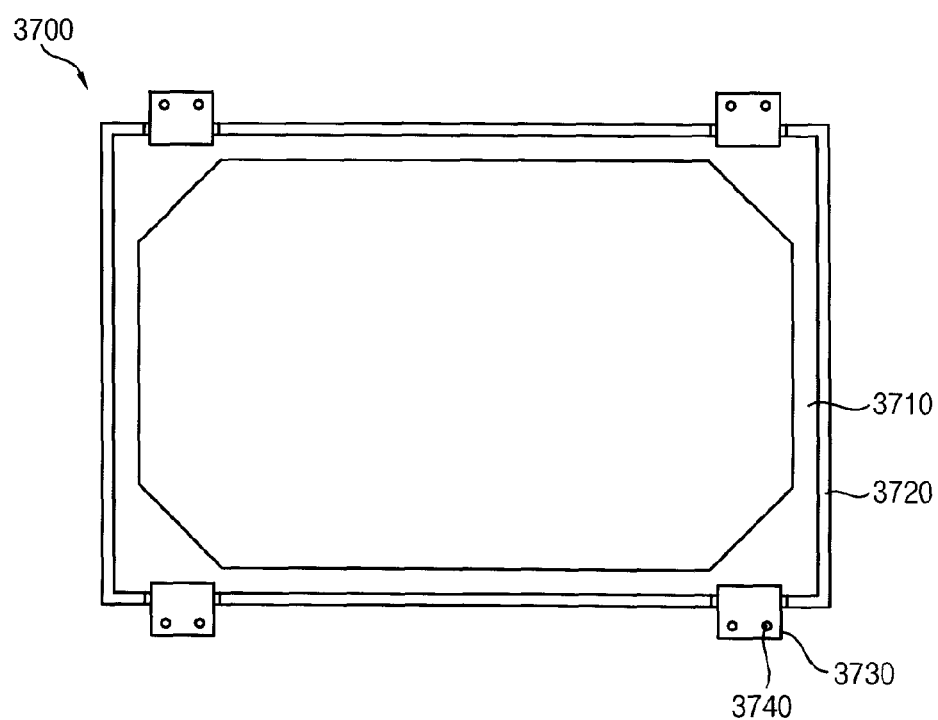
FIG. 11 is a plan view illustrating an exemplary embodiment of a lower receiving container according to the inventive concept.
Figure 12:
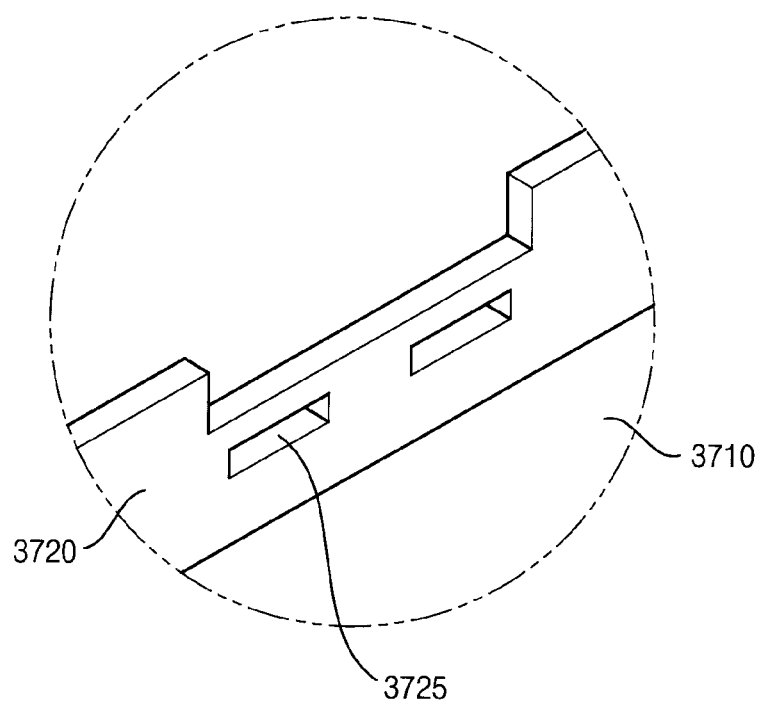
FIG. 12 is a perspective view illustrating an exemplary embodiment of a side wall of a lower receiving container according to the inventive concept.
Figure 13:
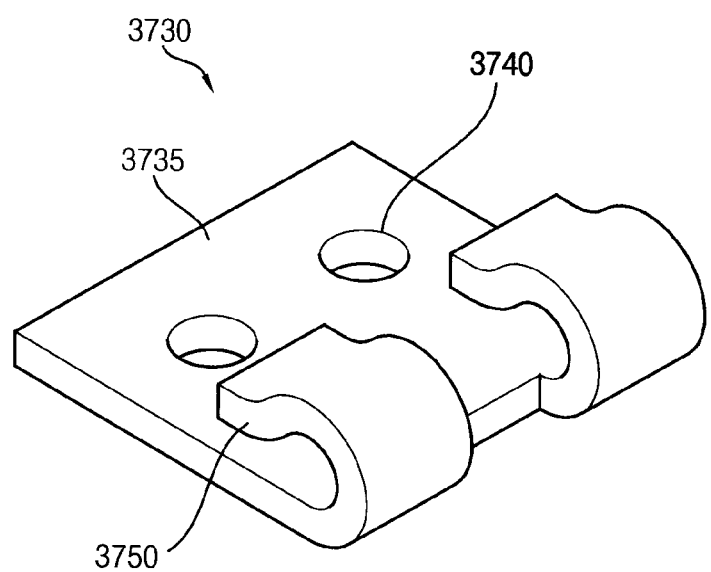
FIG. 13 is a perspective view illustrating an exemplary embodiment of an engaging portion according to the inventive concept.
Figure 14:
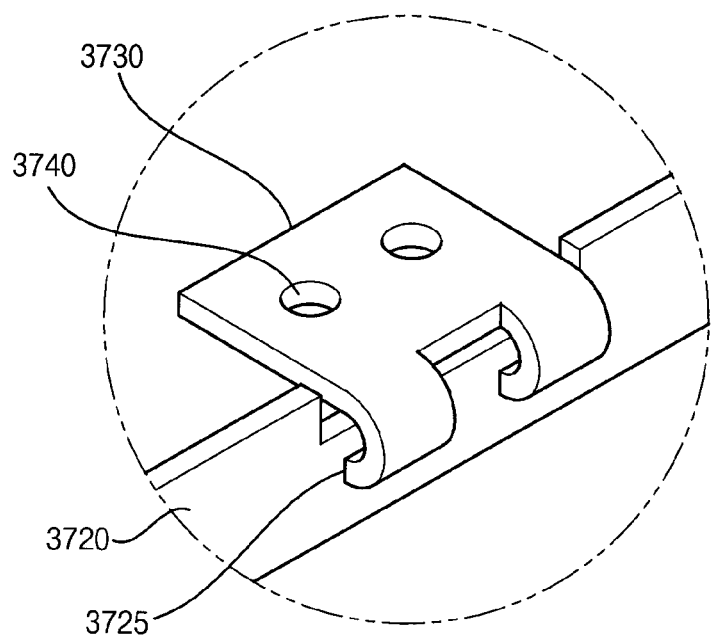
FIG. 14 is a perspective view illustrating an exemplary embodiment of a state an engaging portion is engaged with a side wall.
Figure 15:
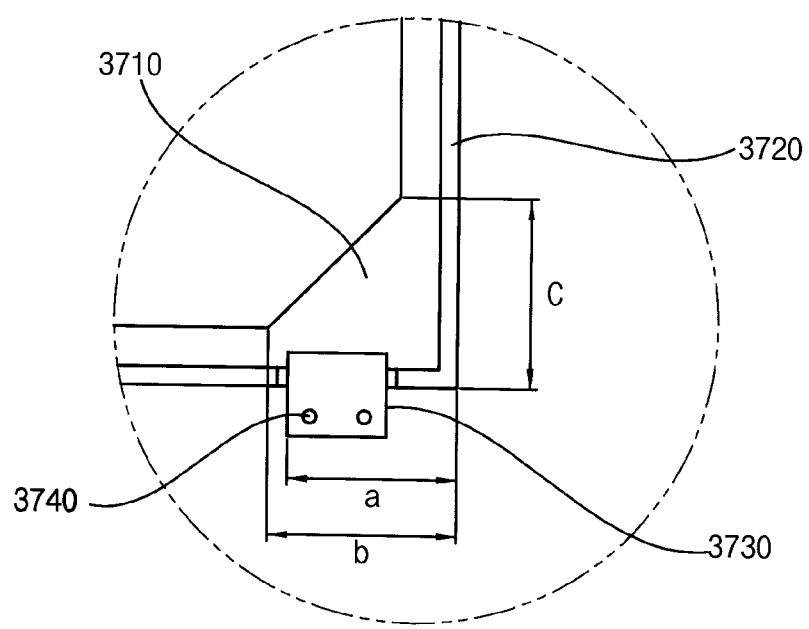
FIG. 15 is a plan view illustrating an exemplary embodiment of an edge portion of a lower receiving container according to the inventive concept.

FIG. 11 is a plan view illustrating an exemplary embodiment of a lower receiving container according to the inventive concept. FIG. 12 is a perspective view illustrating an exemplary embodiment of a side wall of a lower receiving container according to the inventive concept. FIG. 13 is a perspective view illustrating an exemplary embodiment of an engaging portion according to the inventive concept. FIG. 14 is a perspective view illustrating an exemplary embodiment of a state an engaging portion is engaged with a side wall. FIG. 15 is a plan view illustrating an exemplary embodiment of an edge portion of a lower receiving container according to the inventive concept.

Referring to FIGS. 11 to 15, a lower receiving container 3700 according to an exemplary embodiment of the present inventive concept may include a bottom portion 3710, a side wall 3720, and an engaging portion 3730. The engaging portion 3730 may include a fastener hole 3740. The lower receiving container 3700 may be engaged with a cover member. When the lower receiving container 3700 is engaged with a cover member, a screw is inserted into the fastener hole 3740. Thus, the lower receiving container 3700 may be engaged with a cover member.

The bottom portion 3710 may include an opening portion. The bottom portion 3710 may have a chamfered portion in which at least one corner of the opening portion is chamfered. For example, the bottom portion 3710 may have four chamfered portions formed at four edges of the bottom portion 3710. The chamfered portion is formed as a right-angled triangle having a first length b in a first direction and a second length c in a second direction crossing the first direction. The first length b is a length from an end of a shorter side of the lower receiving container 3700 to an end of the chamfered portion in the first direction. The second length c is a length from an end of a longer side of the lower receiving container 3700 to an end of the chamfered portion in the second direction.

The engaging portion 3730 may be engaged with a cover member. For example, the engaging portion 3730 may be engaged to the cover member by a screw. When engaging portion 3730 is engaged to the cover member by a screw, pressure may be generated by the screw. Thus, the engaging portion 3730 may be transformed by the pressure and the lower receiving container 3700 may be transformed if the engaging portion 3730 is transformed. In addition, the transformed lower receiving container 3700 may press the liquid crystal of a display apparatus, such that a fault in the liquid crystal may be created. However, the bottom portion 3710 of the lower receiving container 3700 according to the present exemplary embodiment has a chamfered portion, so that a pressure from the engaging portion 3730 may be diffused. Thus, a fault in the display apparatus may be prevented.

The side wall 3720 may have a first fastener hole 3725. The first fastener hole 3725 may be formed in a longer side of the side wall 3720. The first fastener hole 3725 may be formed adjacent to both ends of the longer side of the side wall 3720. In addition, two first fastener holes 3725 may be formed to be the same size. The fastener portion 3750 of an engaging portion 3730 may be inserted into the first fastener hole 3725.

The engaging portion 3730 may include a body portion 3735, a second fastener hole 3740 and a fastener portion 3750. The fastener portion 3750 extends from the body portion 3735 to be formed as a "U" shape in a cross-sectional view. The fastener portion 3750 may be inserted into the first fastener hole 3725. The fastener portion 3750 may correspond to the first fastener hole 3725. The engaging portion 3730 may include a plurality of second fastener holes 3740. For example, the engaging portion 3730 may include two second fastener holes 3740. A screw may be inserted into the second fastener hole 3740.

The engaging portion 3730 may be engaged with the side wall 3720. The fastener portion 3750 of the engaging portion 3730 is inserted into the first fastener holes 3725 of the side wall 3720. When the engaging portion 3730 is engaged with the side wall 3720, the fastener portion 3750 is disposed under the body portion 3735. When the engaging portion 3730 is engaged with the side wall 3720, the fastener portion 3750 is rotatable. When the engaging portion 3730 is engaged with the side wall 3720, a space between the engaging portion 3730 and the side wall 3720 may be formed. Thus, pressure from the engaging portion 3730 may be offset. Accordingly, pressure from the engaging portion 3730 may not delivered to the lower receiving container 3700.

An inner end of the engaging portion 3730 is spaced apart from a shorter side of the lower receiving container 3700 by a third length a. The third length a is a length from an end of a shorter side of the lower receiving container 3700 to an inner end of the engaging portion 3730. The third length a may be shorter than the first length b.

When engaging portion 3730 is engaged to the cover member by a screw, pressure may be generated by the screw. Thus, the pressure may be delivered to the bottom portion 3710 of the lower receiving container 3700. However, the bottom portion 3710 of the lower receiving container 3700 according to the present exemplary embodiment has a plurality of chamfered portions, so the pressure from the engaging portion 3730 may be diffused. When the third length a is longer than the first length b, the pressure from the engaging portion 3730 may be diffused away from the chamfered portion along the long side of lower receiving container 3700. Thus, the bottom portion 3710 of the lower receiving container 3700 may press the liquid crystal of a display apparatus. Accordingly, a fault in the liquid crystal of a display apparatus may be caused. However, when the third length a is shorter than the first length b, as it is according to the present exemplary embodiment, the pressure from the engaging portion 3730 may be diffused towards the chamfered portion. Thus, the bottom portion 3710 of the lower receiving container 3700 may not press the liquid crystal of a display apparatus. Accordingly, a fault in the liquid crystal of a display apparatus may be prevented.

The engaging portion 3730 may be engaged with a cover member. For example, the engaging portion 3730 may be engaged to the cover member by a screw. When engaging portion 3730 is engaged to the cover member by a screw, a pressure may be generated by the screw. Thus, the engaging portion 3730 may be transformed by the pressure and the lower receiving container 3700 may be transformed if the engaging portion 3730 is transformed. In addition, the transformed lower receiving container 3700 may press the liquid crystal of a display apparatus, such that a fault in the liquid crystal may be created. However, the engaging portion 3730 and the side wall 3720 according to the present exemplary embodiment has a space between the engaging portion 3730 and the side wall 3720, such that a pressure from the engaging portion 3730 may be offset. Accordingly, a pressure from the engaging portion 3730 may not delivered to the lower receiving container 3700. Thus, a fault in the display apparatus may be prevented.

Figure 16:
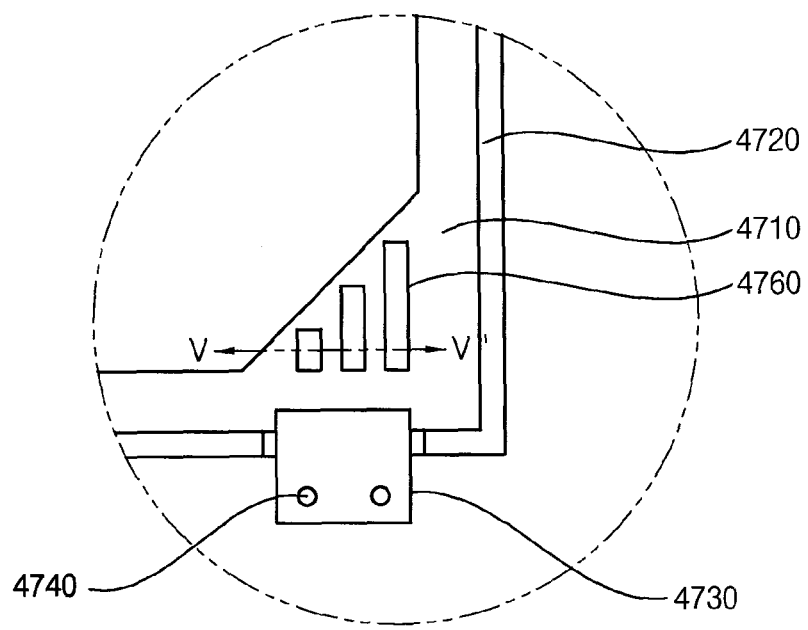
FIG. 16 is a plan view illustrating an exemplary embodiment of an edge portion of a lower receiving container according to the inventive concept.
Figure 17:
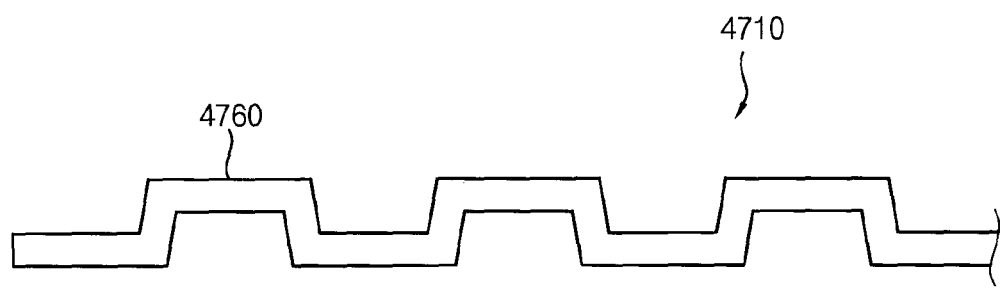
FIG. 17 is a cross-sectional view taken along line V-V' of FIG. 16.

FIG. 16 is a plan view illustrating an exemplary embodiment of an edge portion of a lower receiving container according to the inventive concept. FIG. 17 is a cross-sectional view taken along line V-V' of FIG. 16.

A lower receiving container 4700 according to the present example embodiment is substantially the same as the lower receiving container 3700 according to the previous example embodiment of FIG. 15 excepting for a protruding portion 4760, and thus the same reference numerals will be used to refer to the same or like parts as those described in the previous example embodiment of FIG. 15.

Referring to FIGS. 16 and 17, a lower receiving container 4700 according to an exemplary embodiment of the present inventive concept may include a bottom portion 4710, a side wall 4720 and an engaging portion 4730. The engaging portion 4730 may include a fastener hole 4740. The lower receiving container 4700 may be engaged with a cover member. When the lower receiving container 4700 is engaged with a cover member, a screw is inserted into the fastener hole 4740. Thus, the lower receiving container 4700 may be engaged with a cover member. A plurality of protruding portions 4760 may be formed on the chamfered portion formed at the bottom portion 4710. The protruding portions 4760 may be formed by a beading process.

The protruding portions 4760 may protrude from the bottom portion 4710 in an upper direction away from bottom portion 4710. The protruding portion 4760 may extend in a second direction parallel to a shorter side of the lower receiving container 4700. The protruding portion 4760 may be formed as a rectangle shape in a plan view. The protruding portion 4760 may be formed by a beading process. For example, the protruding portion 4760 may be formed parallel to the second direction. The protruding portion 4760 may be formed as three rectangle shape in a plan view.

According to the present exemplary embodiment, the bottom portion 4710 of the lower receiving container 4700 has a plurality of protruding portions 4760, so that contact between the bottom portion 4710 of the lower receiving container 4700 and the light source unit may be decreased. Thus, pressure from the bottom portion 4710 of the lower receiving container 4700 may be diffused. Thus, a fault in the display apparatus may be prevented.

Figure 18:
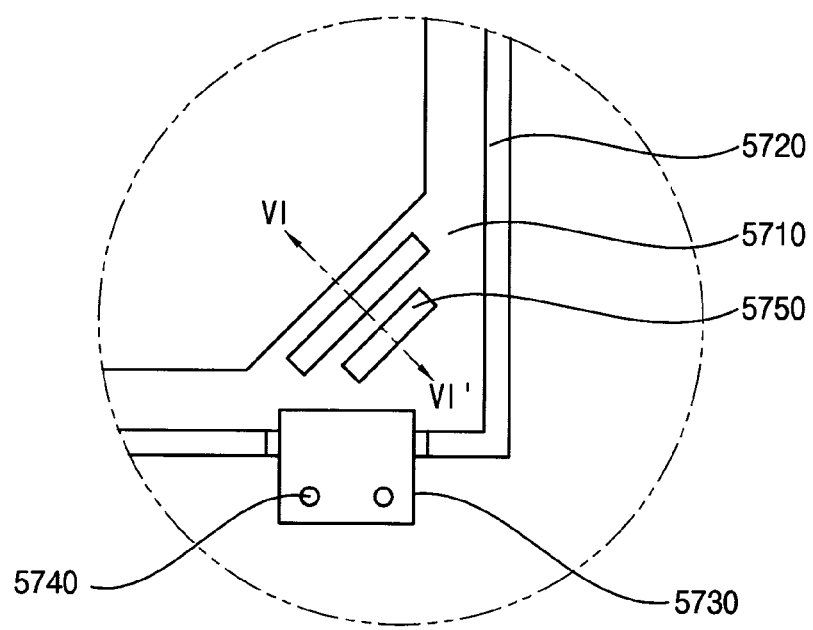
FIG. 18 is a plan view illustrating an exemplary embodiment of an edge portion of a lower receiving container according to the inventive concept.
Figure 19:
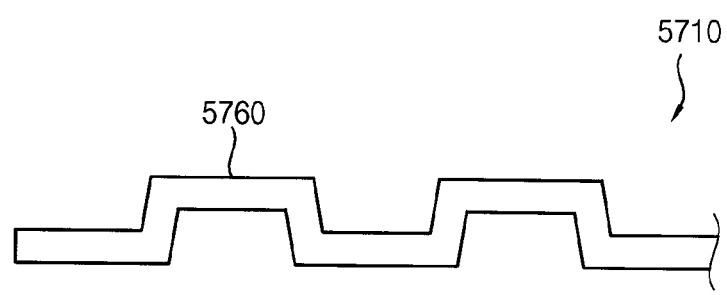
FIG. 19 is a cross-sectional view taken along line VI-VI' of FIG. 18.

FIG. 18 is a plan view illustrating an exemplary embodiment of an edge portion of a lower receiving container according to the inventive concept. FIG. 19 is a cross-sectional view taken along line VI-VI' of FIG. 18.

A lower receiving container 5700 according to the present example embodiment is substantially the same as the lower receiving container 3700 according to the previous example embodiment of FIG. 15 excepting for a protruding portion 5760, and thus the same reference numerals will be used to refer to the same or like parts as those described in the previous example embodiment of FIG. 15.

Referring to FIGS. 18 and 19, a lower receiving container 5700 according to an exemplary embodiment of the present inventive concept may include a bottom portion 5710, a side wall 5720, and an engaging portion 5730. The engaging portion 5730 may include a fastener hole 5740. The lower receiving container 5700 may be engaged with a cover member. When the lower receiving container 5700 is engaged with a cover member, a screw is inserted into the fastener hole 5740. Thus, the lower receiving container 5700 may be engaged with a cover member. A plurality of protruding portions 5760 may be formed on the chamfered portion formed at the bottom portion 5710. The protruding portions 5760 may be formed by a beading process.

The protruding portions 5760 may protrude from the bottom portion 5710 in an upward direction away from bottom portion 5710. The protruding portion 5760 may extend in a direction parallel to an inclined side of the chamfered portion. The protruding portion 5760 may be formed as a rectangle shape in a plan view. The protruding portion 5760 may be formed by a beading process. For example, the protruding portion 5760 may be formed parallel to direction parallel to an inclined side of the chamfered portion. The protruding portion 5760 may be formed as two rectangle shapes in a plan view.

According to the present exemplary embodiment, the bottom portion 5710 of the lower receiving container 5700 has a plurality of protruding portions 5760, so that contact between the bottom portion 5710 of the lower receiving container 5700 and the light source unit may be decreased. Thus, a pressure from the bottom portion 5710 of the lower receiving container 5700 may be diffused. Thus, a fault in the display apparatus may be prevented.

According to the present inventive concept as explained above, the bottom portion of the lower receiving container has a chamfered portion. Thus, pressure from the engaging portion may be diffused. Therefore, the reliability of the display apparatus is improved.

In addition, a rotatable engaging portion is engaged with the side wall of the lower receiving container, so that pressure from the engaging portion may be offset. Therefore, the reliability of the display apparatus is improved.

The foregoing is illustrative of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A display apparatus, comprising:
   a display panel configured to display an image;
   a mold frame supporting the display panel; and
   a lower receiving container receiving the display panel and the mold frame, the lower receiving container comprising:
   a bottom portion comprising an opening and a chamfered portion, the chamfered portion defining at least one chamfered corner of the opening;
   a side wall extending upward away from the bottom portion; and
   an engaging portion extending from the side wall and protruding away from the opening of the bottom portion, the engaging portion comprising a fastener hole configured to be engaged with an external device.

2. The display apparatus of claim 1, further comprising a backlight assembly disposed between the display panel and the lower receiving container.

3. The display apparatus of claim 2, wherein the backlight assembly comprises:
   a light source comprising a light emitting diode; and
   a light guide plate configured to guide a light from the light source.

4. The display apparatus of claim 1, wherein the chamfered portion comprises a right-angled triangle, and further comprises a first length in a first direction and a second length in a second direction crossing the first direction, wherein the first length is measured from an end of a shorter side of the lower receiving container to an end of the chamfered portion in the first direction, and wherein the second length is a length from an end of a longer side of the lower receiving container to an end of the chamfered portion in the second direction.

5. The display apparatus of claim 4, wherein the engaging portion is disposed on the longer side of the lower receiving container, and a length from an end of a shorter side of the lower receiving container to an inner end of the engaging portion is shorter than the first length.

6. The display apparatus of claim 4, wherein the chamfered portion comprises a plurality of protruding portions protruding toward the display panel.

7. The display apparatus of claim 6, wherein each of the plurality of protruding portions extends in the second direction and comprises a rectangle shape in plan view.

8. The display apparatus of claim 6, wherein each of the plurality of protruding portions extends in a direction parallel to an inclined side of the chamfered portion and comprises a rectangle shape in plan view.

9. A display apparatus, comprising:
   a display panel configured to display an image;
   a mold frame disposed under the display panel supporting the display panel; and
   a lower receiving container configured to receive the display panel and the mold frame, the lower receiving container comprising:
   a bottom portion comprising an opening;
   a side wall extending upward away from the bottom portion and comprising a first fastening hole; and
   an engaging portion engaged with the side wall, the engaging portion comprising:
   a body portion; and
   a fastener portion extending from the body portion configured to engage with the first fastening hole, the fastener portion comprising a "U" shape in cross-sectional view.

10. The display apparatus of claim 9, further comprising a backlight assembly disposed between the display panel and the lower receiving container.

11. The display apparatus of claim 10, wherein the backlight assembly comprises:
    a light source comprising a light emitting diode; and
    a light guide plate configured to guide a light from the light source.

12. The display apparatus of claim 9, wherein the bottom portion comprises a chamfered portion, the chamfered portion comprising at least one chamfered corner of the opening.

13. The display apparatus of claim 12, wherein the chamfered portion further comprises a plurality of protruding portions protruding toward the display panel.

14. The display apparatus of claim 13, wherein each of the plurality of protruding portions extends in a direction parallel to a shorter side of the lower receiving container and comprises a rectangle shape in plan view.

15. The display apparatus of claim 13, wherein each of the plurality of protruding portions extends in a direction parallel to an inclined side of the chamfered portion and comprises a rectangle shape in plan view.

16. The display apparatus of claim 9, wherein the mold frame comprises a recess configured to receive the fastener portion.

17. The display apparatus of claim 16, wherein the body portion comprises a second fastener hole configured to be engaged with an external device.

* * * * *